US008222104B2

(12) United States Patent
Booth, Jr. et al.

(10) Patent No.: US 8,222,104 B2
(45) Date of Patent: Jul. 17, 2012

(54) THREE DIMENSIONAL INTEGRATED DEEP TRENCH DECOUPLING CAPACITORS

(75) Inventors: Roger A. Booth, Jr., Hopewell Junction, NY (US); Kangguo Cheng, Albany, NY (US); Ravi M. Todi, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 12/509,780

(22) Filed: Jul. 27, 2009

(65) Prior Publication Data

US 2011/0018095 A1   Jan. 27, 2011

(51) Int. Cl.
*H01L 21/8242* (2006.01)
(52) U.S. Cl. .............. 438/243; 257/296; 257/E21.396
(58) Field of Classification Search .......... 438/106, 438/386, 171, 190, 210, 238–253, 329, 379, 438/387, 444, 901; 257/296–313, 533, 595–602, 257/923–924, E27.016–E27.017, E27.019–E27.021, 257/E27.023–E27.025, E27.03–E27.035, 257/E27.037–E27.038, E27.041–E27.045, 257/E27.047–E27.048, E27.071, E27.09, 257/E27.092–E27.093, E27.095, E27.101, 257/E27.114–E27.116, E21.008–E21.021, 257/E21.364
See application file for complete search history.

(56) References Cited

U.S. PATENT DOCUMENTS

| 5,770,484 | A | * | 6/1998 | Kleinhenz ............... 438/155 |
|---|---|---|---|---|
| 5,811,868 | A | | 9/1998 | Bertin et al. |
| 5,841,182 | A | | 11/1998 | Linn et al. |
| 6,057,188 | A | | 5/2000 | El-Kareh et al. |
| 6,093,623 | A | | 7/2000 | Forbes |
| 6,309,950 | B1 | | 10/2001 | Forbes |
| 6,423,613 | B1 | | 7/2002 | Geusic |
| 6,538,330 | B1 | | 3/2003 | Forbes |
| 6,630,713 | B2 | | 10/2003 | Geusic |
| 6,759,282 | B2 | * | 7/2004 | Campbell et al. ......... 438/149 |
| 6,825,545 | B2 | | 11/2004 | Nasr |
| 6,852,167 | B2 | | 2/2005 | Ahn |
| 6,936,514 | B1 | | 8/2005 | Pelella |
| 7,030,481 | B2 | | 4/2006 | Chudzik et al. |
| 7,098,571 | B2 | | 8/2006 | Adams et al. |
| 7,160,577 | B2 | | 1/2007 | Ahn et al. |
| 7,193,262 | B2 | | 3/2007 | Ho et al. |
| 7,236,284 | B2 | | 6/2007 | Miles |
| 7,261,826 | B2 | | 8/2007 | Adams et al. |
| 2004/0226735 | A1 | | 11/2004 | Wu et al. |
| 2007/0001203 | A1 | | 1/2007 | Lehr et al. |
| 2008/0142924 | A1 | | 6/2008 | Hsu et al. |
| 2010/0283093 | A1 | * | 11/2010 | Pei et al. ................. 257/303 |

* cited by examiner

*Primary Examiner* — Tony Tran
(74) *Attorney, Agent, or Firm* — Cantor Colburn LLP; Joseph Abate

(57) ABSTRACT

A method of forming an integrated circuit device includes forming a plurality of deep trench decoupling capacitors on a first substrate; forming a plurality of active circuit devices on a second substrate; bonding the second substrate to the first substrate; and forming electrical connections between the deep trench capacitors and the second substrate.

4 Claims, 4 Drawing Sheets

THREE DIMENSIONAL INTEGRATED DEEP TRENCH DECOUPLING CAPACITORS

BACKGROUND

The present invention relates generally to semiconductor device manufacturing techniques and, more particularly, to a method of forming three dimensional, integrated decoupling capacitors for integrated circuit devices.

Decoupling capacitors serve as a charge reservoir in integrated circuit (IC) devices to support instantaneous current surges that invariably accompany simultaneous circuit switching. In particular, decoupling capacitors are utilized in advanced electronic computing systems where they are employed both on-chip and across all levels of packaging, including single chip and multi chip modules, board and back plane. In addition, these passive components are typically required in the power distribution systems for ICs to reduce the simultaneous circuit switching noise, or ΔI (delta I) noise. However, the ability to support an adequate decoupling capacitance at high frequencies is of increasing concern in both on-chip and off-chip systems. The relentless scaling to ever-smaller device dimensions and faster circuit speeds at the chip level have driven the demand for higher packaging density, but they also drive a need for new solutions to the increasing decoupling dilemma.

More specifically, decoupling capacitors must not only possess sufficient capacitance, but also must be accessible in time scales comparable to the ever shorter clock cycle times, resulting from increasing circuit speeds. The increase in power efficiency required in microprocessor units (MPUs), especially for portable computing and communication needs, has further exacerbated the problem. By stabilizing the power supply voltage, system performance can be greatly improved. However, state-of-the-art MPUs can have up to 20% of the chip area devoted to decoupling capacitors, which increases cost and chip size.

SUMMARY

In an exemplary embodiment, a method of forming an integrated circuit device includes forming a plurality of deep trench decoupling capacitors on a first substrate; forming a plurality of active circuit devices on a second substrate; bonding the second substrate to the first substrate; and forming electrical connections between the deep trench capacitors and the second substrate.

In another embodiment, an integrated circuit device includes a first substrate bonded to a second substrate; a plurality of deep trench decoupling capacitors formed on the first substrate; a plurality of active circuit devices formed on the second substrate; and electrical connections between the deep trench decoupling capacitors and the second substrate.

BRIEF DESCRIPTION OF THE DRAWINGS

Referring to the exemplary drawings wherein like elements are numbered alike in the several Figures.

DETAILED DESCRIPTION

Existing passive decoupling elements are generally based on thin or thick film ceramic technology, thin film on silicon, or several small discrete surface mounted devices built into one large package. In the case of electronic package applications, discrete capacitors do not have sufficiently low enough parasitic inductance to be used in high frequency or high-speed circuits being proposed for the near future. With respect to on-chip decoupling devices, thick oxide (e.g., 25 Å) planar capacitors are also used. However, such devices result in very low capacitor density.

The ability to bury passive devices within printed wiring board or modules opens up space for mounting other components that now can be placed where previously discrete passive components were located. The thin film-based IP devices exhibit better high frequency performance and provide easier component integration schemes. These components must be fabricated using technology compatible with carrier materials and fabrication processes. In addition, to meet future high performance needs, the decoupling elements must be electrically accessible within a time frame comparable to the clock cycle times of device chips.

Building these elements on the processor or memory chip would provide an acceptable access time, but on the other hand would take up chip real estate away from active circuits that are built on these high performance chips. It would therefore be desirable to be able to provide decoupling capacitors and resistors with appropriate properties, and to locate them such that they are accessible to the device circuitry on the chips within a time close to the chip clock cycle.

Accordingly, disclosed herein is a method of forming three dimensional, integrated decoupling capacitors for IC devices. Briefly stated, a first semiconductor substrate is used to form deep trench decoupling capacitors, while a second semiconductor substrate is used to form the active circuit devices to be subsequently connected to the decoupling capacitors. The second substrate is then physically bonded to the first substrate. In so doing, the benefits of deep trench capacitors are realized, but without taking any chip real estate from the active circuits, as they are formed on a separate substrate. Moreover, the deep trench capacitors may be formed with higher conductivity fill materials (e.g., copper, tungsten, titanium nitride, silicide, carbon nanotube, amorphous carbon, graphene, etc.) that would otherwise be susceptible to diffusion and other high-temperature effects associated with active circuit processing steps such as dopant diffusion annealing.

Figure 1:
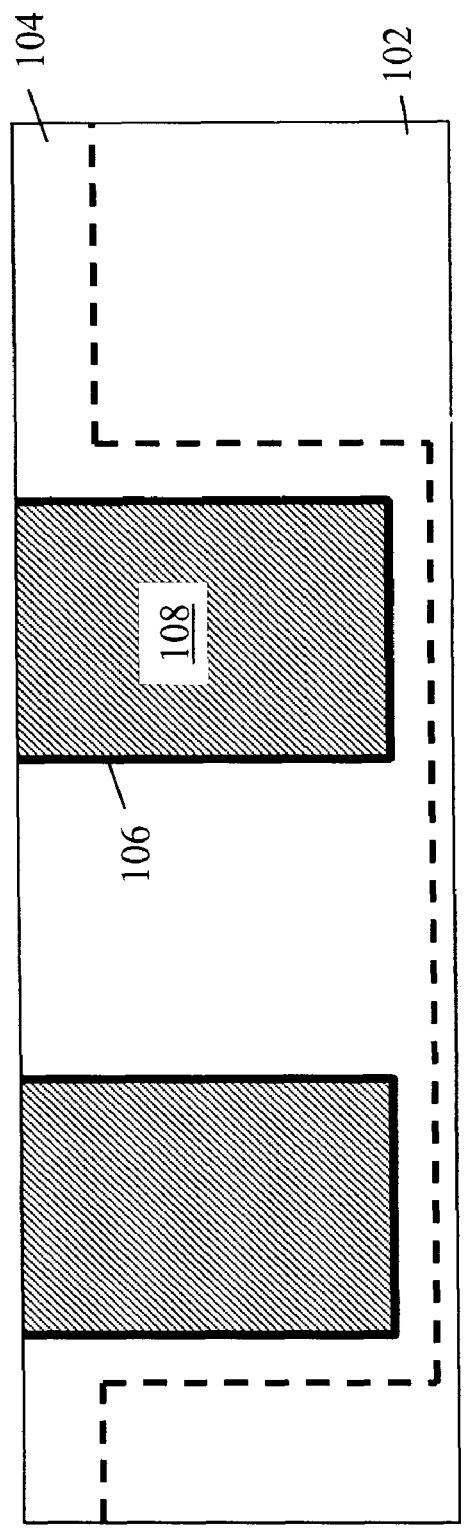
FIGS. 1 through 4 are a series of cross sectional views illustrating a method of forming three dimensional, integrated decoupling capacitors for IC devices, in accordance with an embodiment of the invention.

Referring initially to FIG. 1, there is shown a cross sectional view of a first portion 100 of an integrated circuit device. The first portion 100 includes a substrate 102 (e.g., silicon). The first portion 100 is used for the formation of deep trench decoupling capacitors. As such, the substrate 102 is patterned with deep trenches through lithography, followed by mask opening and reactive ion etching (RIE). Once the trenches are formed, a doped region 104 is formed within the substrate 102 by implantation of a suitable dopant species (such as arsenic, or phosphorous, for example). Notably, the choice of dopants is somewhat more flexible with respect to active semiconductor device formation, as subsequent high-temperature processes are avoided by using a separate substrate for the deep trench capacitor formation. It should also be appreciated that region 104 may also be formed by other processes in lieu of ion implantation including, but not limited to, for example: arsenic silicon glass (ASG) film deposition and thermal drive-in, gas phase doping, and plasma immersion ion implantation.

With the doped region 104 forming a common electrode for the deep trench capacitors, a node dielectric layer 106 (e.g., oxide, oxynitride, nitride, hafnium oxide, etc.) is formed over the doped region 104, including the trench bottom and sidewall surfaces. The node dielectric 106 is followed by deep trench fill with a low resistivity material 108 such as copper, tungsten, titanium nitride, silicide, carbon nanotube, amorphous carbon, or graphene, for example. After the fill material 108, node dielectric 106 and other optional layers (e.g., cap layers) are planarized, the resulting structure appears as in FIG. 1. That is, an exemplary pair of deep trench capacitors includes upper electrodes defined by the trench fill material 108, capacitor dielectric 106, and lower electrode(s) defined by the doped region 104.

Figure 2:
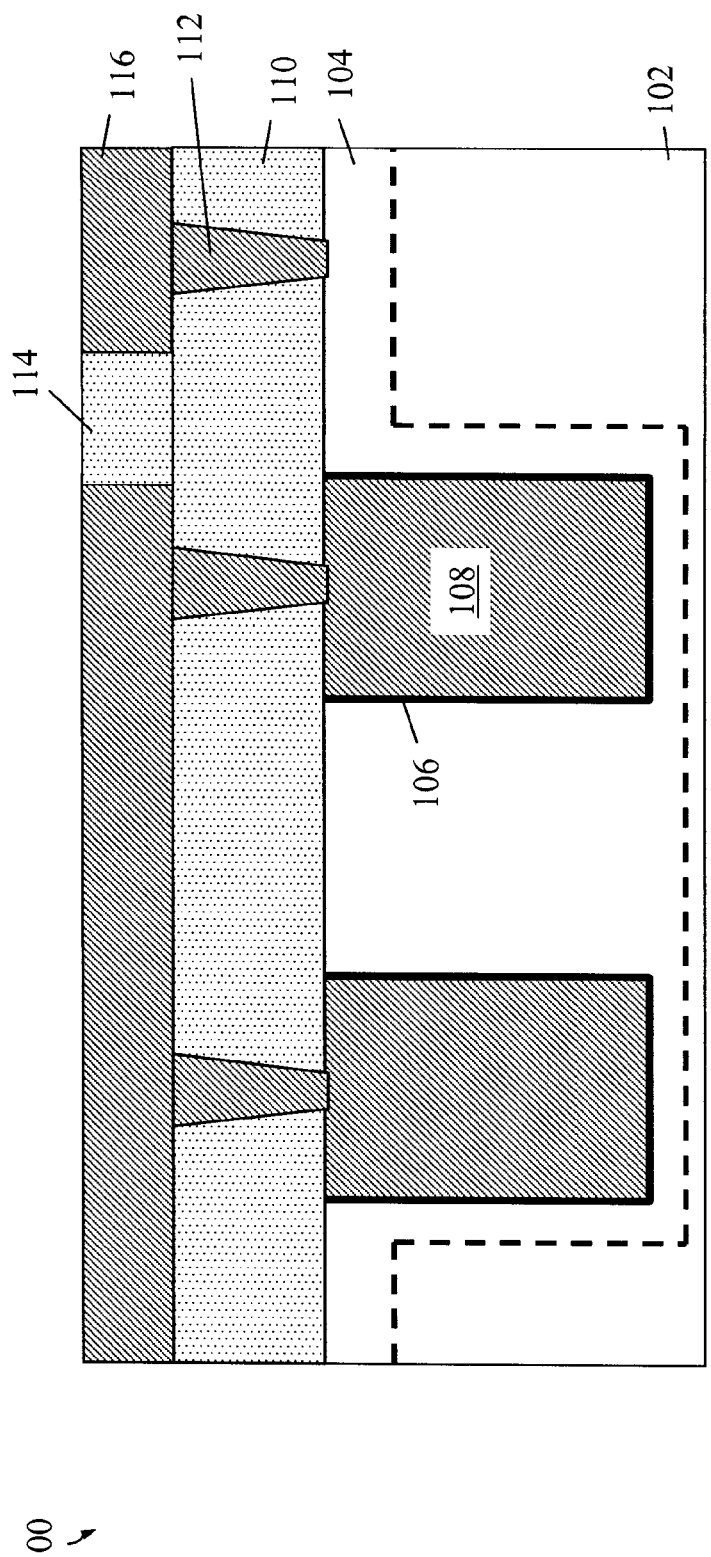

As then shown in FIG. 2, an interlevel dielectric (ILD) layer 110 is then formed over the deep trench capacitors. In order to eventually connect the capacitors to active circuit devices (e.g., processor logic, memory, etc.), a plurality of vias 112 is formed within the ILD layer 112. Notably, the vias are used to connect to both electrodes of the capacitors (i.e., the doped region 104 and the trench fill material 108). If single damascene processing is used, another ILD layer 114 is then formed, followed by metal layers 116 that interconnect the vias 112. Alternatively, the metal layers 116 and vias 112 can be formed in a dual damascene fashion, within a single ILD layer.

Figure 3:
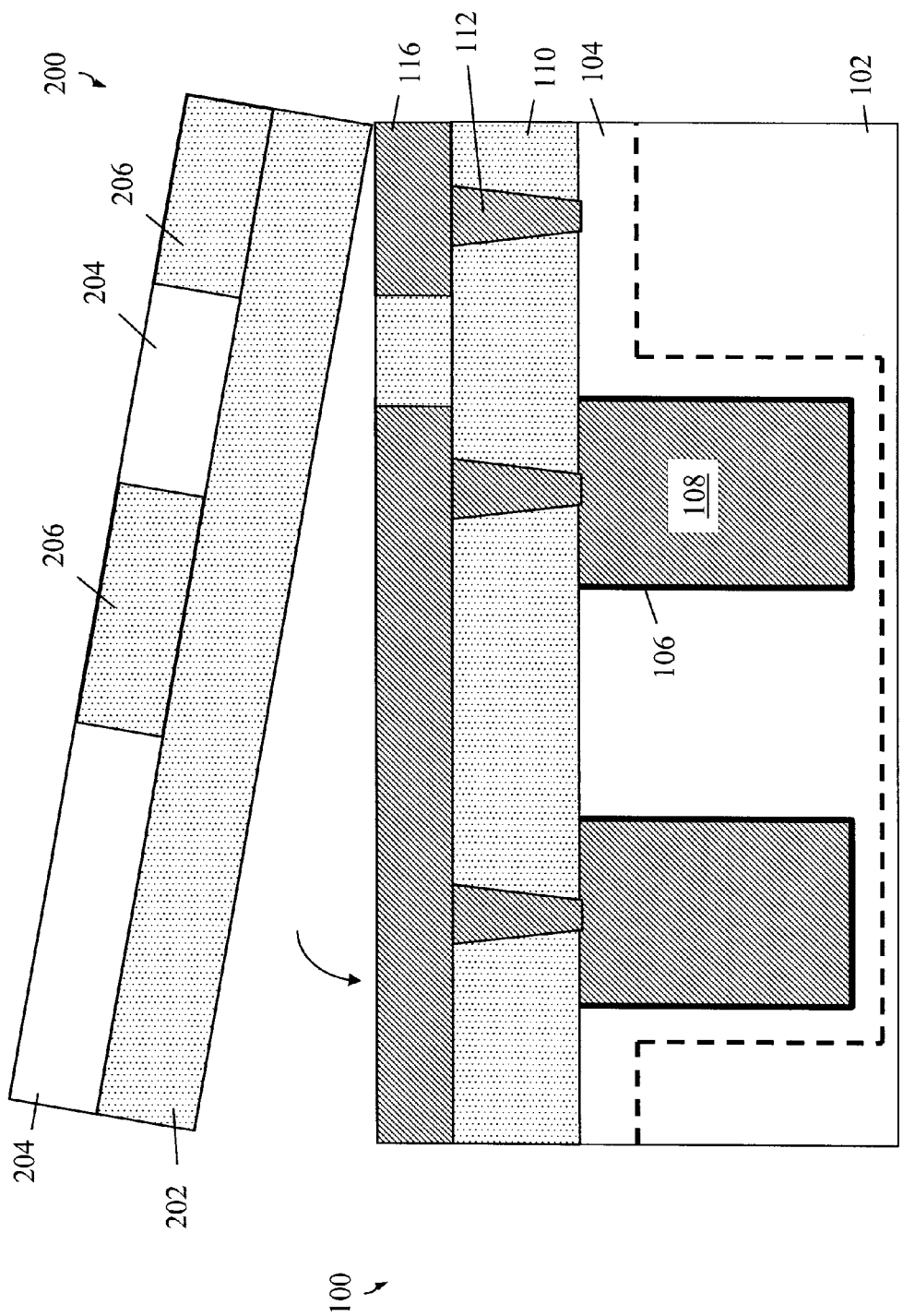

Referring now to FIG. 3, there is shown, in addition to the first portion 100, a second portion 200 of an integrated circuit device. The second portion 200 is formed on a completely separate substrate, such as a silicon-on-insulator (SOI) substrate. In the embodiment depicted, the second portion includes a buried oxide (BOX) layer 202 of an SOI substrate, and an SOI layer 204 upon which active devices are formed in accordance with existing processes. The SOI layer 204 may include various isolation regions 206 therein (e.g., oxide) to electrically isolate portions of the active device circuitry from one another. As will also be noted, the bulk layer of the SOI substrate has been removed, leaving the BOX layer 204 as the bottom layer of the second portion 200. As further shown in FIG. 3, the second portion 200 is positioned over the first portion 100 in preparation for subsequent bonding therebetween. In particular, the oxide material of the BOX layer 202 may be bonded, for example, to oxide material of the ILD layer 114 of the first portion 100 by thermal annealing.

Figure 4:
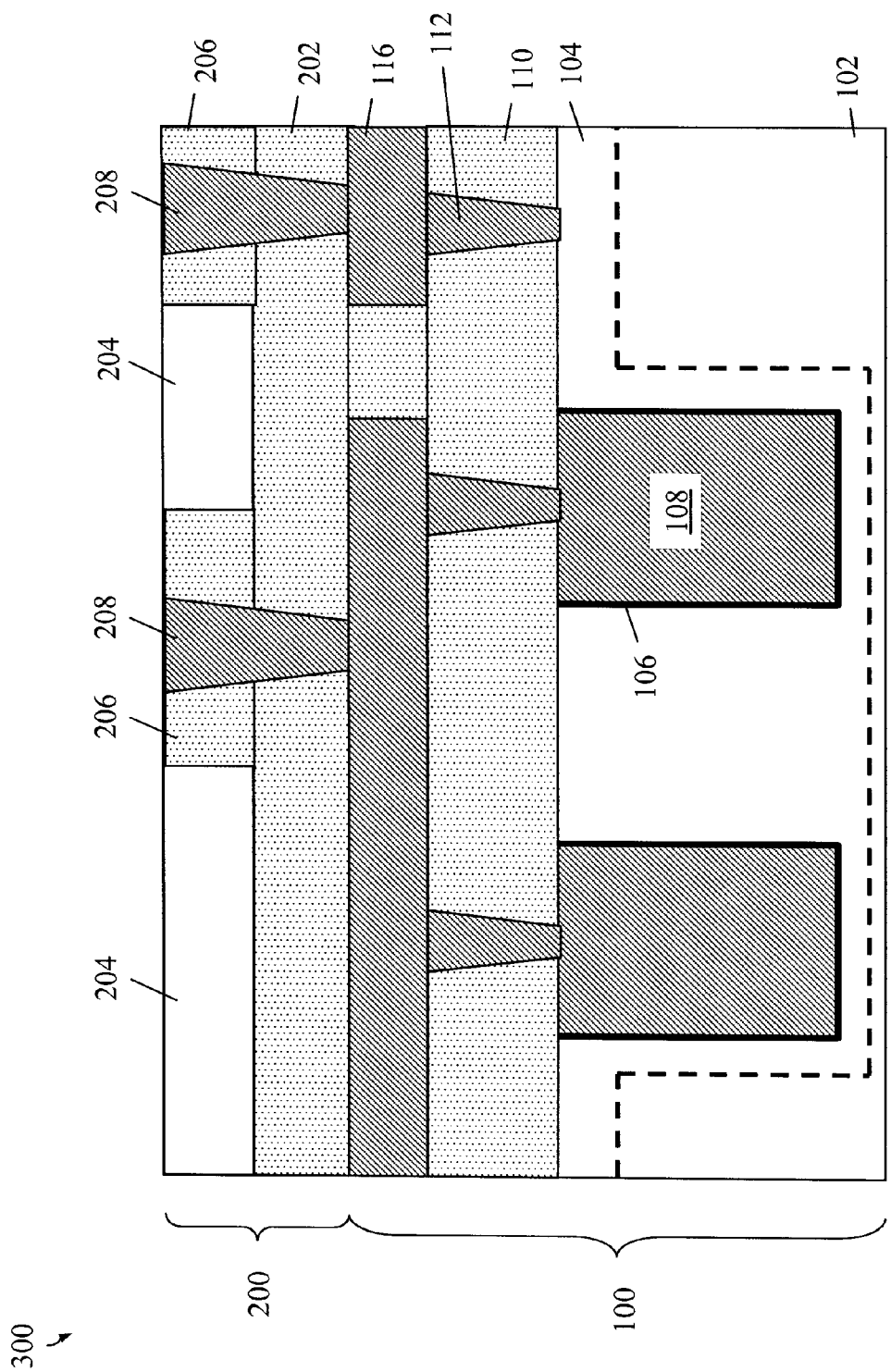

Finally, as shown in FIG. 4, additional vias 208 are defined through the isolation regions 206 in order to provide electrical coupling between active devices formed on the SOI layer 204 of the second portion 200 and the deep trench decoupling capacitors formed in the first portion 100. Thus configured, the resulting IC structure 300 provides high performance decoupling capacitors having various advantages over decoupling capacitors for IC devices. For example, the deep trench capacitors (being on a lower level of the device may be uniformly distributed over the whole wafer or at least significant portion of wafer. Accordingly, it is not necessary to scale the capacitors for each new generation of devices. As also mentioned above, low resistivity metal deep trench fill material may be used to lower the RC constant and to improve the high frequency response of the decoupling capacitor, since the high temperature steps associated with active circuit device processing takes place on a separate wafer prior to bonding. Moreover, for a certain trench technology node, larger deep trench capacitors can be used with higher capacitance values and lower RC time constants.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming an integrated circuit device, the method comprising:

forming a plurality of deep trench decoupling capacitors on a first substrate, the deep trench capacitors configured so as to have an upper capacitor electrode and a lower capacitor electrode such that a top surface of the upper capacitor electrode is substantially coplanar with a top surface of the lower capacitor electrode, wherein forming the plurality of deep trench decoupling capacitors on the first substrate comprises forming deep trenches within the first substrate, forming a doped region within the first substrate so as to define the lower capacitor electrode, and filling the deep trenches with a node dielectric material and a conductive fill material, the conductive fill material defining the upper capacitor electrodes;

forming a plurality of active circuit devices on a second substrate;

prior to bonding the second substrate to the first substrate, forming an inter-level dielectric layer on the first substrate, over the deep trench decoupling capacitors, and forming a plurality of vias within the inter-level dielectric layer, the vias providing electrical access to the upper electrodes and common lower electrode of the deep trench capacitors;

bonding the second substrate to the first substrate; and forming electrical connections between the deep trench decoupling capacitors and the second substrate;

wherein the second substrate comprises a lower buried oxide layer and a silicon-on-insulator (SOI) layer formed on the buried oxide layer, with the active circuit devices formed on the SOI layer; and wherein the bonding the second substrate to the first substrate further comprises thermal annealing to bond the buried oxide layer of the second substrate to oxide material of the inter-level dielectric layer of the first substrate.

2. The method of claim 1, wherein forming the doped region within the first substrate comprises one or more of: ion implantation, arsenic silicon glass (ASG) film deposition and thermal drive-in, gas phase doping, and plasma immersion ion implantation.

3. The method of claim 1, wherein the conductive fill material comprises one or more of: copper, tungsten, titanium nitride, silicide, carbon nanotube, amorphous carbon, and graphene.

4. The method of claim 1, further comprising implanting the doped region with one or more of arsenic and phosphorous.

* * * * *